(12) United States Patent
Frankel et al.

(10) Patent No.: US 9,859,135 B2
(45) Date of Patent: Jan. 2, 2018

(54) SUBSTRATE RINSING SYSTEMS AND METHODS

(71) Applicant: Applied Materials, Inc., Santa Clara, CA (US)

(72) Inventors: Jonathan S. Frankel, Los Gatos, CA (US); Brian J. Brown, Palo Alto, CA (US); Vincent S. Francischetti, Columbia Falls, MT (US); Paul McHugh, Kalispell, MT (US); Kyle M. Hanson, Kalispell, MT (US); Ekaterina Mikhaylichenko, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 14/626,903

(22) Filed: Feb. 19, 2015

(65) Prior Publication Data
US 2016/0175857 A1   Jun. 23, 2016

Related U.S. Application Data

(60) Provisional application No. 62/094,938, filed on Dec. 19, 2014.

(51) Int. Cl.
*B05B 1/04*       (2006.01)
*H01L 21/67*      (2006.01)
*H01L 21/02*      (2006.01)

(52) U.S. Cl.
CPC ........ *H01L 21/67051* (2013.01); *B05B 1/046* (2013.01); *H01L 21/67057* (2013.01); *H01L 21/02052* (2013.01)

(58) Field of Classification Search
CPC ................................................. H01L 21/67051
See application file for complete search history.

(56) References Cited

U.S. PATENT DOCUMENTS 5,609,305 A    3/1997  Webb
6,328,814 B1  12/2001  Fishkin
(Continued)

OTHER PUBLICATIONS

International Search Report and Written Opinion of International Application No. PCT/US2015/065648 dated Mar. 31, 2016.
(Continued)

*Primary Examiner* — Jason Ko
*Assistant Examiner* — Spencer Bell
(74) *Attorney, Agent, or Firm* — Dugan & Dugan, PC

(57) ABSTRACT

An example waterfall apparatus includes (1) a first portion of a first width having (a) a first plenum, a second plenum, and a restricted fluid path therebetween; (b) a first coupling surface; and (c) an inlet opening that creates a fluid path between the first coupling surface and the first plenum; and (2) a second portion of a second width larger than the first width and having (a) a second coupling surface; and (b) an inlet aligned with the first portion inlet opening. The first and second coupling surfaces form a slot that extends along at least a portion of a length of the waterfall apparatus and that connects to the second plenum. Fluid introduced into the second portion inlet fills the first plenum, travels through the restricted fluid path to the second plenum, and exits the slot between the first and second portions to form a rinsing fluid waterfall.

15 Claims, 10 Drawing Sheets

(56) References Cited

U.S. PATENT DOCUMENTS

| | | |
|---|---|---|
| 8,322,045 B2 | 12/2012 | Stein et al. |
| 8,869,422 B2 | 10/2014 | Velazquez et al. |
| 8,900,400 B2 | 12/2014 | Kholodenko et al. |
| 9,352,471 B1 | 5/2016 | Velazquez et al. |
| 2003/0102385 A1 | 6/2003 | Nguyen |
| 2003/0192570 A1 | 10/2003 | Thakur |
| 2003/0209255 A1 | 11/2003 | Brown et al. |
| 2004/0031167 A1 | 2/2004 | Stein et al. |
| 2004/0115567 A1 | 6/2004 | Mandal et al. |
| 2006/0201532 A1 | 9/2006 | Shirazi |
| 2007/0281094 A1 | 12/2007 | Nishio et al. |
| 2008/0017320 A1 | 1/2008 | Choi et al. |
| 2008/0163900 A1 | 7/2008 | Richards |
| 2009/0032068 A1 | 2/2009 | Stein et al. |
| 2009/0078292 A1 | 3/2009 | Stein et al. |
| 2010/0325913 A1 | 12/2010 | Wang |
| 2013/0048765 A1* | 2/2013 | Kholodenko ..... H01L 21/67051 239/589 |
| 2013/0283634 A1 | 10/2013 | Velazquez |
| 2016/0178279 A1 | 6/2016 | Velazquez et al. |
| 2016/0181086 A1 | 6/2016 | Mikhaylichenko et al. |
| 2016/0201986 A1 | 7/2016 | Velazquez et al. |

OTHER PUBLICATIONS

Non-Final Office Action of U.S. Appl. No. 14/602,114 dated Mar. 9, 2017.
International Preliminary Report on Patentability of International Application No. PCT/US2015/065648 dated Jun. 29, 2017.
Jul. 3, 2017 Reply to Mar. 9, 2017 Non-Final Office Action of U.S. Appl. No. 14/602,114.
Final Office Action of U.S. Appl. No. 14/602,114 dated Oct. 18, 2017.

* cited by examiner

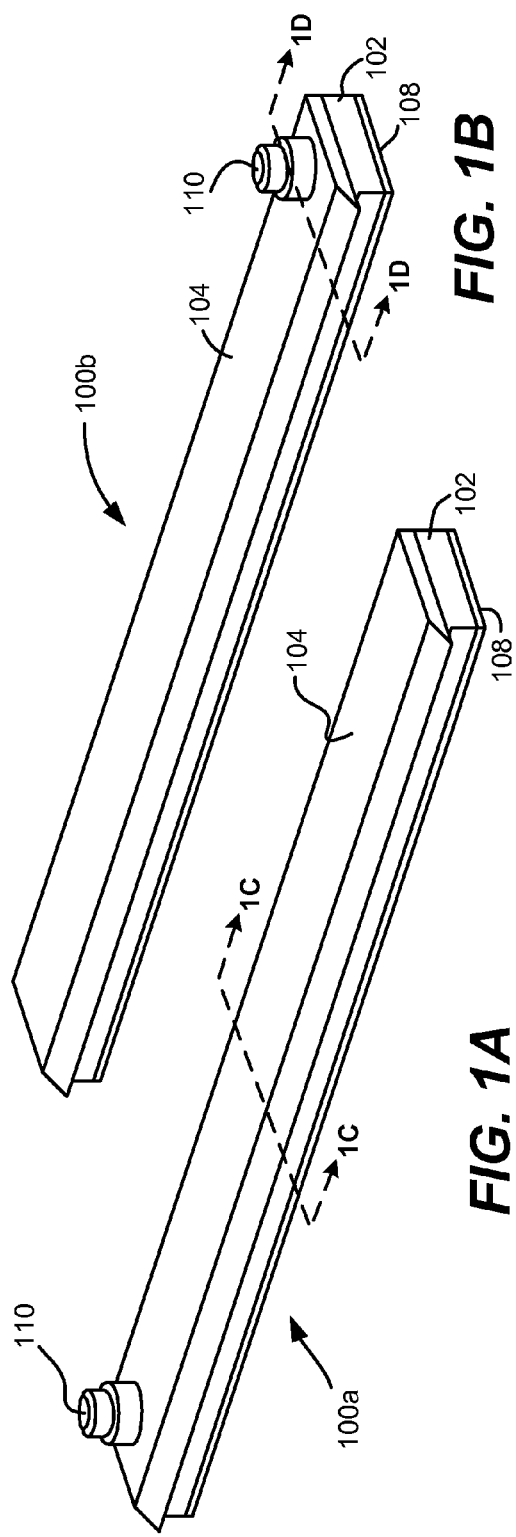

SUBSTRATE RINSING SYSTEMS AND METHODS

RELATED APPLICATION

The present application claims priority to U.S. Provisional Patent Application No. 62/094,938 filed Dec. 19, 2014, and entitled "SUBSTRATE RINSING SYSTEMS AND METHODS", which is hereby incorporated by reference herein in its entirety for all purposes.

FIELD

The present application relates to semiconductor device manufacturing and is more particularly related to substrate rinsing systems and methods.

BACKGROUND

As semiconductor device geometries continue to decrease, the importance of ultra clean processing increases. Aqueous cleaning within a tank of fluid (or a bath) followed by a rinsing bath (e.g., within a separate tank, or by replacing the cleaning tank fluid) may achieve desirable cleaning levels. After removal from the rinsing bath, absent use of a drying apparatus, bath fluid may evaporate from the substrate's surface and cause streaking, spotting and/or leave bath residue on the surface of the substrate. Such streaking, spotting and residue can cause subsequent device failure. Accordingly, much attention has been directed to improved methods for drying a substrate as it is removed from an aqueous bath.

A method known as Marangoni drying creates a surface tension gradient to induce bath fluid to flow from the substrate in a manner that leaves the substrate virtually free of bath fluid, and thus may avoid streaking, spotting and residue marks. Specifically, during Marangoni drying a solvent miscible with the bath fluid (e.g., IPA vapor) is introduced to a fluid meniscus which forms as the substrate is lifted from the bath or as the bath fluid is drained past the substrate. The solvent vapor is absorbed along the surface of the fluid, with the concentration of the absorbed vapor being higher at the tip of the meniscus. The higher concentration of absorbed vapor causes surface tension to be lower at the tip of the meniscus than in the bulk of the bath fluid, causing bath fluid to flow from the drying meniscus toward the bulk bath fluid. Such a flow is known as a "Marangoni" flow, and can be employed to achieve substrate drying with reduced streaks, spotting or bath residue on the substrate.

Achieving uniform Marangoni drying of a substrate can be difficult and in some cases particles from the bath fluid may re-attach to and contaminate the substrate. As such, methods and apparatus for reducing particle re-attachment during rinsing and/or substrate drying are desired.

SUMMARY

In some embodiments, a waterfall apparatus configured to provide rinsing fluid to a substrate is provided that includes (1) a first portion of a first width having (a) a first plenum, a second plenum separated from the first plenum, and a restricted fluid path between the first and second plenums; (b) a first coupling surface; and (c) an inlet opening that creates a fluid path between the first coupling surface and the first plenum; and (2) a second portion of a second width that is larger than the first width and having (a) a second coupling surface; and (b) an inlet that aligns with the inlet opening of the first portion to create a fluid path to the first plenum through the second portion. The first coupling surface of the first portion and the second coupling surface of the second portion form a slot that extends along at least a portion of a length of the waterfall apparatus and that connects to the second plenum. Fluid introduced into the inlet of the second portion fills the first plenum of the first portion, travels through the restricted fluid path to the second plenum, and exits the slot between the first and second portions to form a rinsing fluid waterfall.

In some embodiments, a system configured to rinse a substrate is provided that includes a frontside waterfall apparatus, a backside waterfall apparatus, and a mounting mechanism that adjustably positions the frontside waterfall apparatus and the backside waterfall apparatus a predetermined distance apart so as to allow a substrate to pass between the frontside waterfall apparatus and the backside apparatus during a rinsing operation. Each of the frontside waterfall apparatus and the backside waterfall apparatus includes (1) a first portion of a first width having (a) a first plenum, a second plenum separated from the first plenum, and a restricted fluid path between the first and second plenums; (b) a first coupling surface; and (c) an inlet opening that creates a fluid path between the first coupling surface and the first plenum; and (2) a second portion of a second width that is larger than the first width and having (a) a second coupling surface; and (b) an inlet that aligns with the inlet opening of the first portion to create a fluid path to the first plenum through the second portion. The first coupling surface of the first portion and the second coupling surface of the second portion form a slot that extends along at least a portion of a length of the waterfall apparatus and that connects to the second plenum. Fluid introduced into the inlet of the second portion fills the first plenum of the first portion, travels through the restricted fluid path to the second plenum, and exits the slot between the first and second portions to form a rinsing fluid waterfall.

In some embodiments, a method of rinsing a substrate is provided that includes (1) providing a waterfall apparatus configured to provide rinsing fluid to a substrate comprising (a) a first portion of a first width having (i) a first plenum, a second plenum separated from the first plenum, and a restricted fluid path between the first and second plenums; (ii) a first coupling surface; and (iii) an inlet opening that creates a fluid path between the first coupling surface and the first plenum; and (b) a second portion of a second width that is larger than the first width and having (i) a second coupling surface; and (ii) an inlet that aligns with the inlet opening of the first portion to create a fluid path to the first plenum through the second portion; wherein the first coupling surface of the first portion and the second coupling surface of the second portion form a slot that extends along at least a portion of a length of the waterfall apparatus and that connects to the second plenum and wherein fluid introduced into the inlet of the second portion fills the first plenum of the first portion, travels through the restricted fluid path to the second plenum, and exits the slot between the first and second portions to form a rinsing fluid waterfall; (2) positioning a substrate in front of the slot of the waterfall apparatus; (3) directing a rinsing fluid into the inlet of the second portion to fill the first plenum of the first portion so that the rinsing fluid travels through the restricted fluid path to the second plenum, and exits the slot between the first and second portions to form a rinsing fluid waterfall; and (4) directing the rinsing fluid waterfall at the substrate to rinse the substrate. Numerous other aspects are provided.

Other features and aspects of the present invention will become more fully apparent from the following detailed description, the appended claims and the accompanying drawings.

BRIEF DESCRIPTION OF THE DRAWINGS

FIG. 1A is a perspective view of an example embodiment of a waterfall apparatus provided herein in accordance with one or more embodiments of the invention.

FIG. 1B illustrates an alternative waterfall apparatus that is similar to the waterfall apparatus of FIG. 1A provided herein in accordance with one or more embodiments of the invention.

FIG. 1C illustrates a cross-sectional view of the waterfall apparatus of FIG. 1A taken along line 1C-1C in FIG. 1A.

FIG. 1D illustrates a cross-sectional view of the waterfall apparatus and inlet of FIG. 1B taken along line 1D-1D in FIG. 1B.

DETAILED DESCRIPTION

Figure 1E:
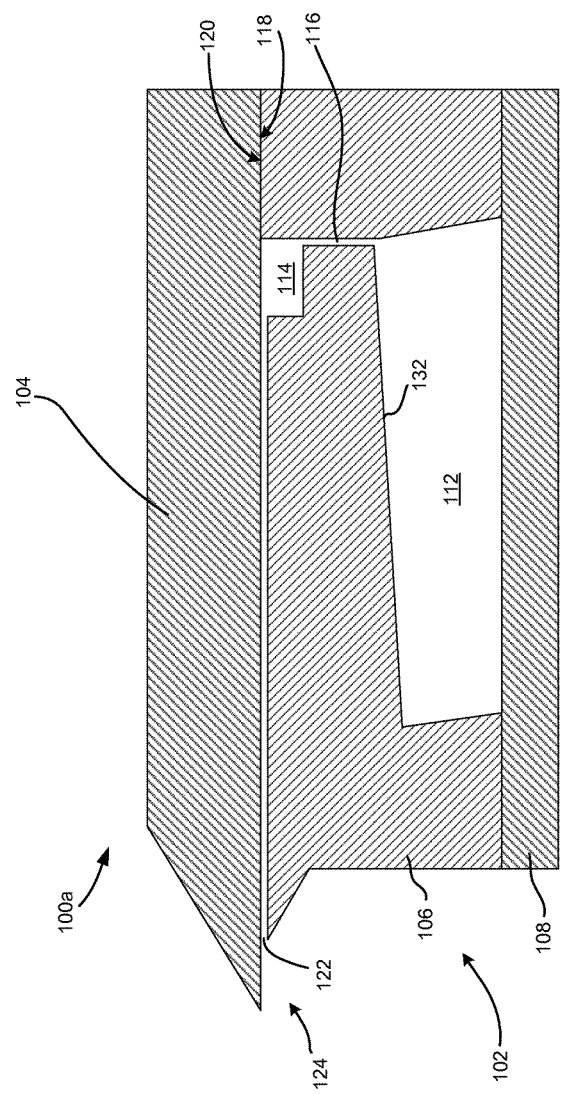
FIG. 1E illustrates an enlarged view of the cross-section of FIG. 1C.

As described previously, in some instances, particles from rinsing bath fluid used to rinse a substrate following a cleaning process may re-attach to and contaminate the substrate. For example, particles may re-attach to the substrate if the rinsing bath fluid used to rinse a substrate following cleaning has a different pH than the chemistry used during the prior cleaning step. In addition, contaminants may accumulate in the rinsing tank and may re-attach to a substrate as it is removed during drying. While such particle re-attachment may be reduced by adding chemicals to the rinsing fluid, adding chemistry to the final rinse tank may result in chemistry remaining on the substrate following drying.

In some embodiments provided herein, a highly uniform rinsing fluid curtain is employed to provide improved final rinsing of a substrate such as during Marangoni drying. For example, a "waterfall" plate may be provided above a final rinse tank to generate a highly-uniform rinsing fluid curtain that is blanketed by a flow of solvent (e.g., isopropyl alcohol (IPA) in a nitrogen carrier gas) to rinse and dry substrates after chemical mechanical planarization (CMP) and/or another cleaning process. While described as a waterfall, it will be understood that any suitable rinsing fluid may be used (e.g., de-ionized water, de-ionized water having a rinsing agent that reduces surface tension, gas-infused de-ionized water such as de-ionized water infused with $O_3$, $CO_2$, $N_2$, etc.). In some embodiments, the waterfall is formed by forcing fluid flow through a narrow planar slot (e.g., formed between two plates).

In some embodiments, particle re-attachment may be avoided by submersion of a substrate into a rinsing fluid tank with chemistry such as an acid or base, HCl acid, HF acid, an organic alkaline, tetramethylammonium hydroxide (TMAH), ammonium hydroxide, another pH adjuster, or the like, and then lifting the substrate out of the tank through a waterfall, a top surface of which is blanketed with a flow of solvent such as an $N_2$/IPA gas mixture. The resultant rinsing fluid curtain effectively rinses chemistry from the substrate, and the $N_2$/IPA gas over the waterfall may provide Marangoni drying with reduced and/or minimized particle re-attachment.

FIG. 1A is a perspective view of an example embodiment of a waterfall apparatus 100a provided herein in accordance with one or more embodiments of the invention. As shown in FIG. 1A, the waterfall apparatus 100a may include a first (lower) portion 102 coupled to a second (upper) portion 104. Any suitable coupling mechanism may be employed to couple the first and second portions 102, 104, such as screws, bolts, adhesives and/or the like. In some embodiments, the first (lower) portion 102 includes a main body 106 and a bottom plate 108 coupled to the main body 106 (e.g., a single-piece lower portion 102 or a multi-piece lower portion 102 may be employed). The second (upper) portion 104 includes an inlet 110 described further below.

The first portion 102 and/or second portion 104 may be fabricated from any suitable material such as aluminum, stainless steel, quartz, polyether ether ketone (PEEK), combinations of the same, or the like. Other materials may be employed.

FIG. 1B illustrates an alternative waterfall apparatus 100b that is similar to the waterfall apparatus 100a of FIG. 1A. In the waterfall apparatus 100b of FIG. 1B, the inlet 110 is located near an opposite end of the waterfall apparatus 100b as shown.

Figure 1F:
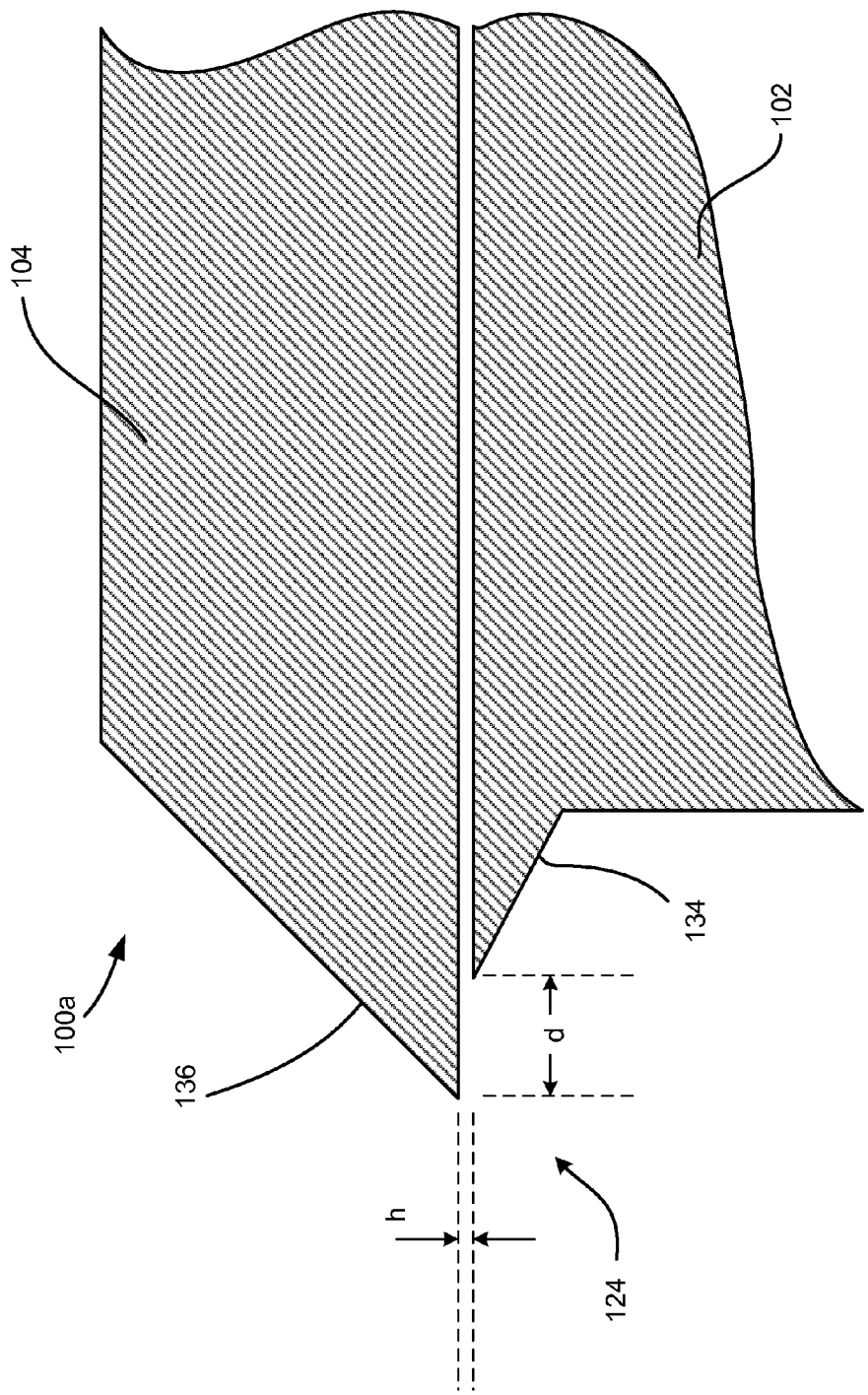
FIG. 1F illustrates an enlarged view of an outlet portion of the waterfall apparatus of FIG. 1A.
Figure 1G:
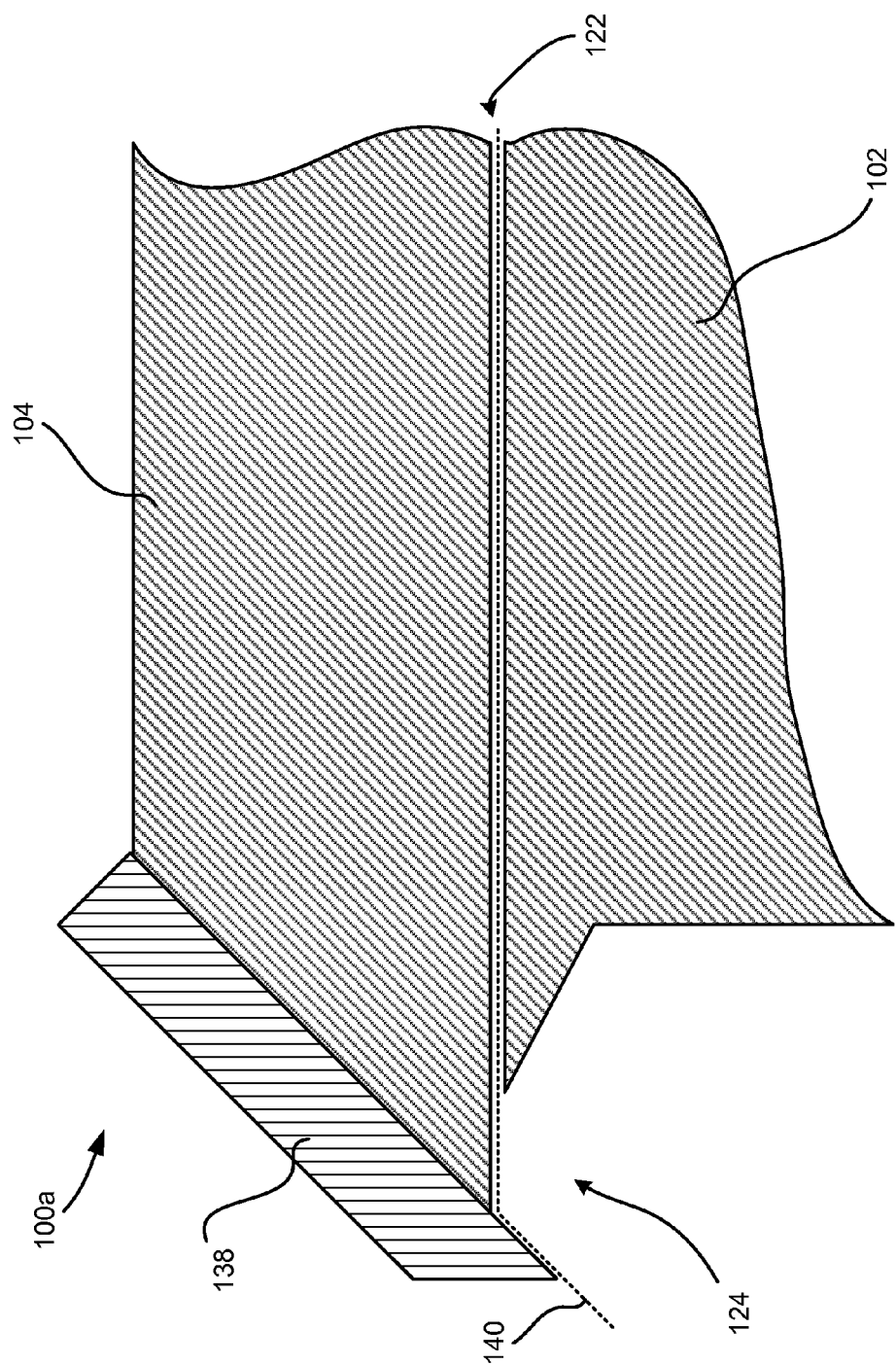
FIG. 1G is similar to FIG. 1F but illustrates the use of a flow deflector at an outlet of the waterfall apparatus of FIG. 1A in accordance with one or more embodiments of the invention.
Figure 1H:
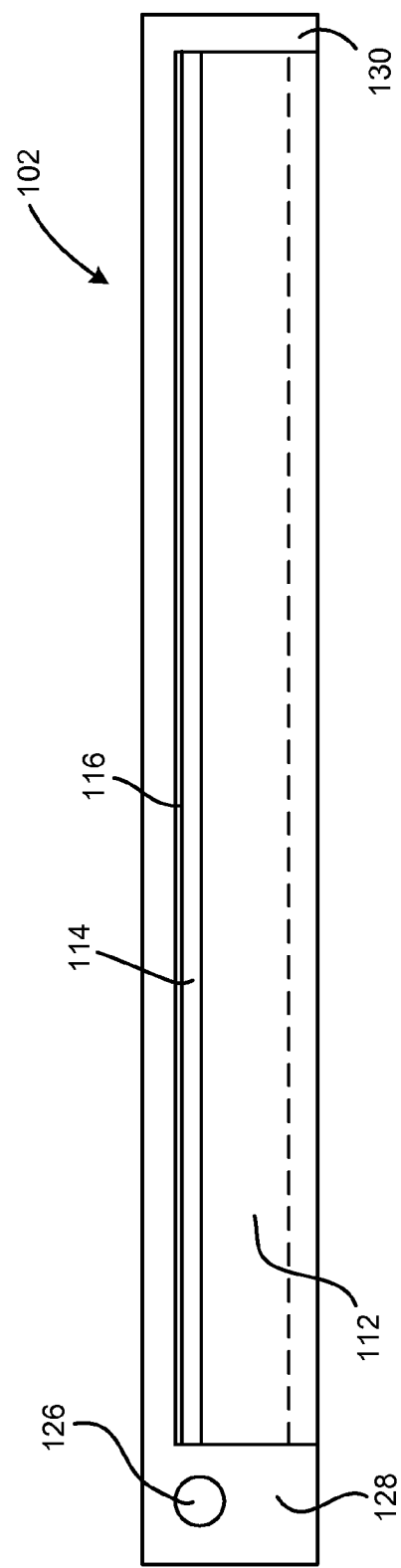
FIG. 1H is a top view of the first portion of the waterfall apparatus of FIG. 1A with the second portion removed in accordance with one or more embodiments of the invention.

FIG. 1C illustrates a cross-sectional view of the waterfall apparatus 100a taken along line 1C-1C in FIG. 1A. FIG. 1D illustrates a cross-sectional view of the waterfall apparatus 110b and inlet 110 taken along line 1D-1D in FIG. 1B. FIG. 1E illustrates an enlarged view of the cross-section of FIG. 1C, and FIG. 1F illustrates an enlarged view of an outlet portion of the waterfall apparatus 100a. FIG. 1G is similar to FIG. 1F but illustrates the use of a flow deflector (described further below) at an outlet of the waterfall apparatus 100a. FIG. 1H is a top view of the first (lower) portion 102 of the waterfall apparatus 100a with the second (top) portion 104 removed.

With reference to FIG. 1C and FIG. 1E, the first portion 102 of the waterfall apparatus 100a includes a first plenum 112 separated from a second plenum 114 by a restricted fluid path 116. When the first and second portions 102, 104 are coupled together via a first coupling surface 118 of the first portion 102 and a second coupling surface 120 of the second portion 104, a slot 122 is formed therebetween that extends from the second plenum 114 to an outlet 124 of the waterfall apparatus 100a (or waterfall apparatus 100b). As shown in FIG. 1D, the first portion 102 includes an inlet opening 126 that creates a fluid path between the first coupling surface 118 and the first plenum 112 through the first portion 102. The inlet 110 aligns with the inlet opening 126 of the first portion 102 to create a fluid path to the first plenum 112 through the second (upper) portion 104. As will be described further below, fluid introduced into the inlet 110 of the second portion 104 fills the first plenum 112 of the first portion 102, travels through the restricted fluid path 116 to the second plenum 114, and exits the slot 122 between the first and second portions 102, 104 to form a rinsing fluid waterfall.

In the embodiments shown, the volume of the first plenum 112 is larger than the volume of the second plenum 114. In some embodiments, the volume of the second plenum 114 may be the same or larger than the volume of the first plenum 112.

In some embodiments provided herein, the first plenum 112, the second plenum 114 and the restricted fluid path 116 (and/or slot 122) have a similar length and extend nearly the entire length of the first portion 102 (as shown in FIG. 1H). For example, the first plenum 112, the second plenum 114, the restricted fluid path 116 and/or the slot 122 may be approximately the same overall length of the waterfall apparatus 100a or 110b, minus the material thickness employed to form the inlet region 128 and opposite side wall 130 of the first portion 102 as shown in FIG. 1H. Other and/or different lengths may be used for the first plenum 112, the second plenum 114, the restricted fluid path 116 and/or the slot 122.

With reference to FIG. 1E, in some embodiments, a roof (upper side) 132 of the first plenum 112 may be angled relative to the first coupling surface 118 of the first portion 102. Such an arrangement may reduce air trapping and/or bubble formation within the rinsing fluid and/or the first plenum 112. For example, in some embodiments, the roof 132 may have the angle between about 1 and 10 degrees relative to the first coupling surface 118 (e.g., below horizontal in FIG. 1E). In other embodiments, the roof 132 may have an angle between about 3 and 6 degrees relative to the first coupling surface 118. In yet other embodiments, the roof 132 may have an angle greater than about 3 degrees relative to the first coupling surface 118. Larger or smaller roof angles may be employed.

Example volumes for the first plenum 112 range from about 120 to about 480 cm^3 for a 300 mm substrate. Example volumes for the second plenum 114 range from about 3 to about 12 cm^3 for a 300 mm substrate. Other plenum volumes may be employed. In some embodiments, the first plenum 112 may have a volume that is about 40 times the volume of the second plenum 114. Other plenum volumes and/or plenum volume ratios may be used.

The restricted fluid path 116 creates a pressure increase in the rinsing fluid travelling from the first plenum 112 to the second plenum 114. The rinsing fluid pressure then decreases as the rinsing fluid exits the restricted fluid path 116 and expands into the second plenum 114. This may result in a highly uniform rinsing fluid pressure within the second plenum 114, and thus a highly uniform rinsing fluid pressure within the slot 122.

In some embodiments, the restricted fluid path 116 may have a width of less than about 2 mm, and in some embodiments between about 0.5 to 0.8 mm. Larger or smaller restricted fluid path widths may be employed.

The slot 122 is shown as being formed primarily in the first portion 102. For example, a portion of the first coupling surface 118 of the first portion 102 may be machined away to form the slot 122. In other embodiments, the slot 122 may be similarly formed in the second coupling surface 120 of the second portion. In yet other embodiments, the slot 122 may be formed by removing material from both first and second coupling surfaces 118, 120.

As shown in FIG. 1F, in some embodiments, the slot 122 may have a height h of less than about 0.5 mm, and in some embodiments, a height of about 0.2 mm or less. Larger or smaller slot heights may be employed. Example slot widths (e.g., the distance from the slot outlet 124 to the second plenum 114) may be about 20 mm or larger in some embodiments, and about 30 mm or larger in some embodiments. Other slot widths may be employed.

With reference to FIGS. 1E-1F, in some embodiments, the first (lower) portion 102 has a smaller width than the second (upper) portion 104. For example, the top of the slot 122 extends further at the outlet 124 than the bottom of the slot 122 (e.g., by a distance d in FIG. 1F). In some embodiments, the distance d may be about 5 mm or less, and in some embodiments, about 2 to 3 mm. Other distances may be used. In one or more embodiments, the ends of the first and second portions 102, 104 at the outlet 124 of slot 122 are terminated with sharp edges as shown. For example, lower portion face 134 and/or upper portion face 136 may be angled relative to slot 122 to create sharp terminating edges. Example angles range from about 30 to 60 degrees relative to slot 122, although other angles may be used. Use of sharp edges has been found to reduce rinsing fluid adhesion at the edge/fluid interface and may improve rinsing fluid flow rate, pressure and/or spray pattern uniformity at outlet 124 in some embodiments.

With reference to FIG. 1G, in some embodiments, a flow deflector 138 may be coupled to and/or formed as part of the second portion 104 to redirect a rinsing fluid stream 140 exiting the outlet 124 of slot 122. For example, a flow deflector 138 may be attached to the second portion 104 to redirect the rinsing fluid stream 140 (e.g., downward) at a desired angle. In some embodiments, the rinsing fluid stream 140 may be redirected at an angle of about 40 to 60 degrees, and in some embodiments at an angle of about 45 to 50 degrees, below the path of the slot 122, although other angles may be used. Redirecting rinsing fluid in this manner may facilitate adjustment of the angle with which rinsing fluid strikes a surface of a substrate as will be described further below with reference to FIGS. 4-5.

Figure 2:
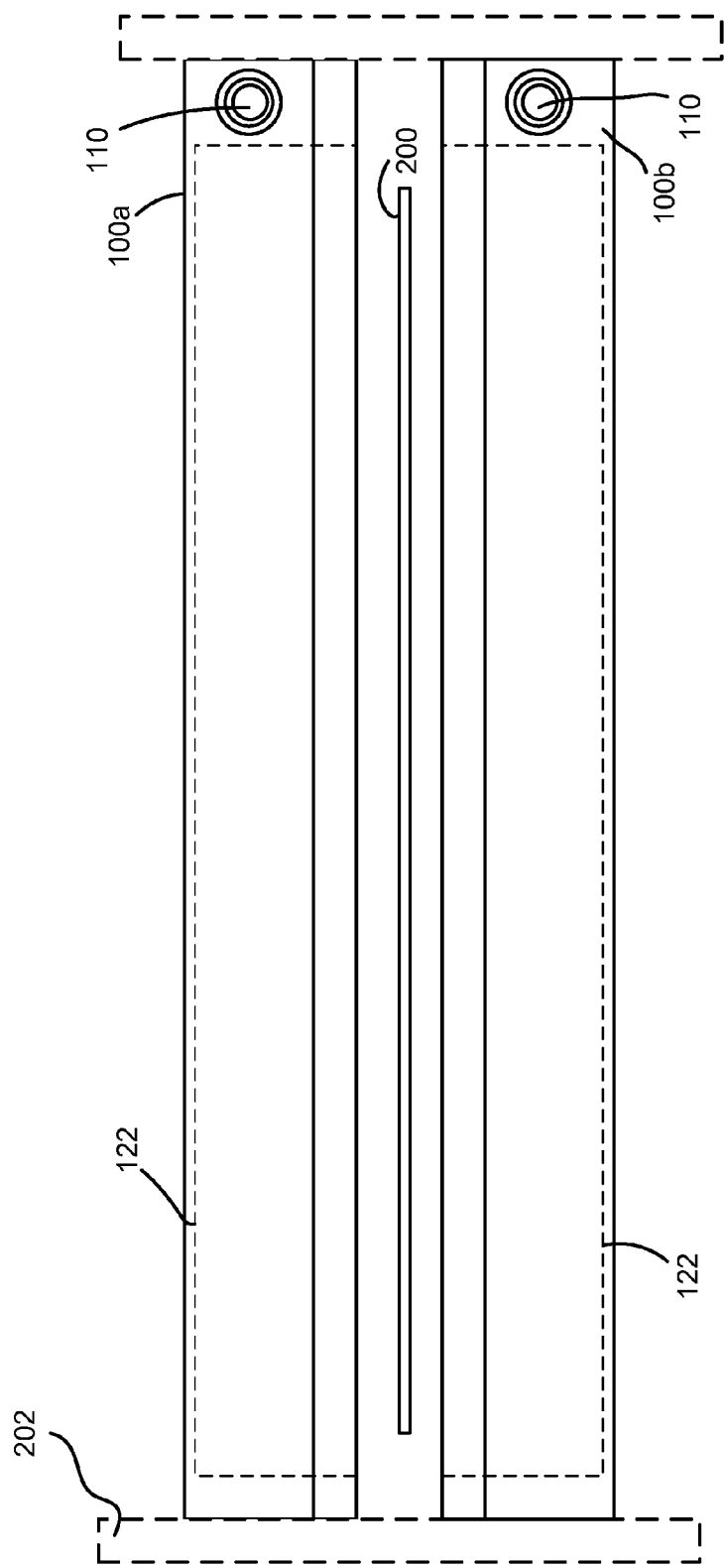
FIG. 2 is a top view of the waterfall apparatus of FIG. 1A and waterfall apparatus of FIG. 1B positioned for rinsing a substrate in accordance with one or more embodiments of the invention provided herein.

FIG. 2 is a top view of waterfall apparatus 100a and waterfall apparatus 100b positioned for rinsing a substrate 200 in accordance with one or more embodiments of the invention provided herein. As shown in FIG. 2, waterfall apparatus 100a is positioned to spray rinsing fluid on a first side (e.g., a front or device side) of substrate 200 and waterfall apparatus 100b is positioned to spray rinsing fluid on a second side (e.g., a back side) of substrate 200 as substrate 200 is moved between and past waterfall apparatus 100a and waterfall apparatus 100b. The waterfall apparatus 100a and/or 110b may be positioned using a frame or similar structure 202 (shown in phantom). An example frame/structure for supporting waterfall apparatus 100a and 100b is described below with reference to FIG. 4 and may be used to adjust one or more of the gap between the substrate 200 and each waterfall apparatus, the height of each waterfall apparatus and/or the angle of rotation of each waterfall apparatus.

Figure 3:
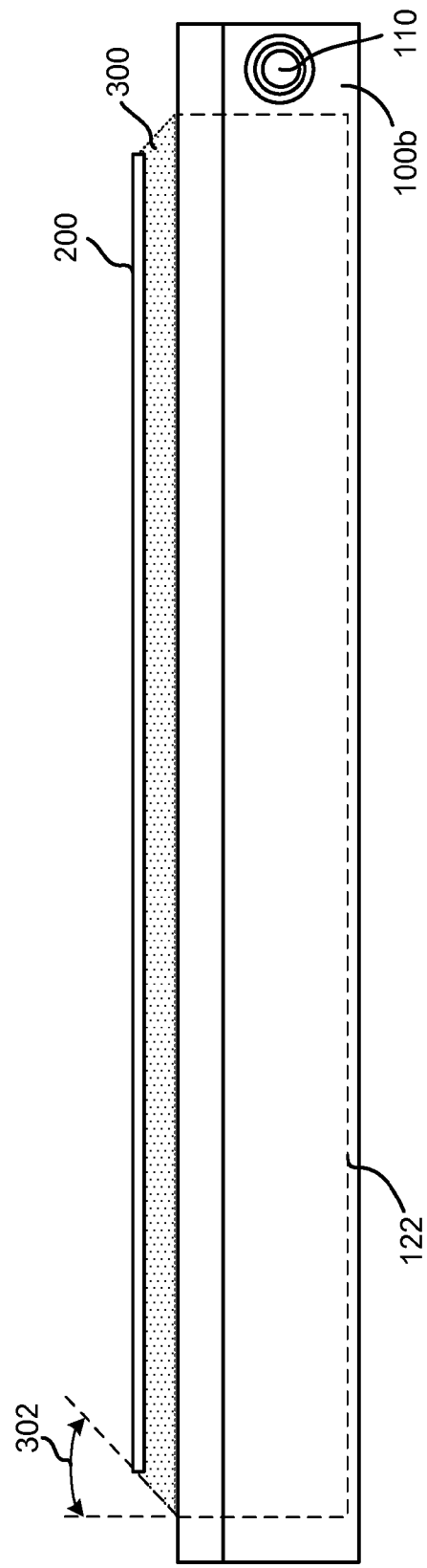
FIG. 3 is a top view of the waterfall apparatus of FIG. 1B outputting a waterfall directed toward a substrate in accordance with one or more embodiments of the invention provided herein.

In the embodiment of FIG. 2, the slot 122 of each waterfall apparatus 100a, 100b is longer than a diameter of the substrate 200 rinsed by each waterfall apparatus 100a, 100b. This may compensate for bending of the outer edges of the waterfall output by each waterfall apparatus 100a, 100b toward the center of the waterfall due to capillary action at the outer edges (e.g., the rinsing fluid at the outer edges of the waterfall is pulled toward the rinsing fluid in the bulk or center region of the waterfall due to surface tension). For example, FIG. 3 is a top view of the waterfall apparatus 100b outputting a waterfall 300 directed toward substrate 200. As depicted in FIG. 3, as the slot 122 outputs the waterfall 300, the outer edges of the waterfall 300 are bent toward the center of the waterfall 300 as shown by bending angle 302. The amount of bending at the edges of waterfall 300 depends on numerous factors such as surface tension and/or velocity of the rinsing fluid, the height of the slot 122, the length of the slot 122, flow rate of the rinsing fluid, horizontal distance from the slot 122 to the substrate, fluid density, or the like. It is also noted that the closer the substrate 200 is to the waterfall apparatus 100b, the less effect the bending angle has on coverage of the substrate 200.

To compensate for the above described bending angle, in some embodiments, the length of slot 122 of waterfall apparatus 110a and/or 110b may be approximately 10 to 100 mm longer, and in some embodiments about 30 to 70 mm longer, than a diameter of the substrate 200 rinsed with the waterfall apparatus 100a and/or 100b. (In some embodiments, the first plenum 112, second plenum 114 and/or restricted fluid path 116 may have the same or similar lengths.) For example, for a 300 mm substrate, in some embodiments, the slot 122 of waterfall apparatus 100a and/or 100b may be approximately 310 to 400 mm in length, and in some embodiments about 330 to 370 mm in length. Larger or smaller slot lengths may be employed. In some embodiments, rinsing fluid surface tension, rinsing fluid velocity/flow rate, slot height, etc., may be adjusted to reduce bending angle. For example, a lower surface tension rinsing fluid and/or higher flow rate may be used, slot height may be decreased, a higher density rinsing fluid may be employed, etc.

Figure 4:
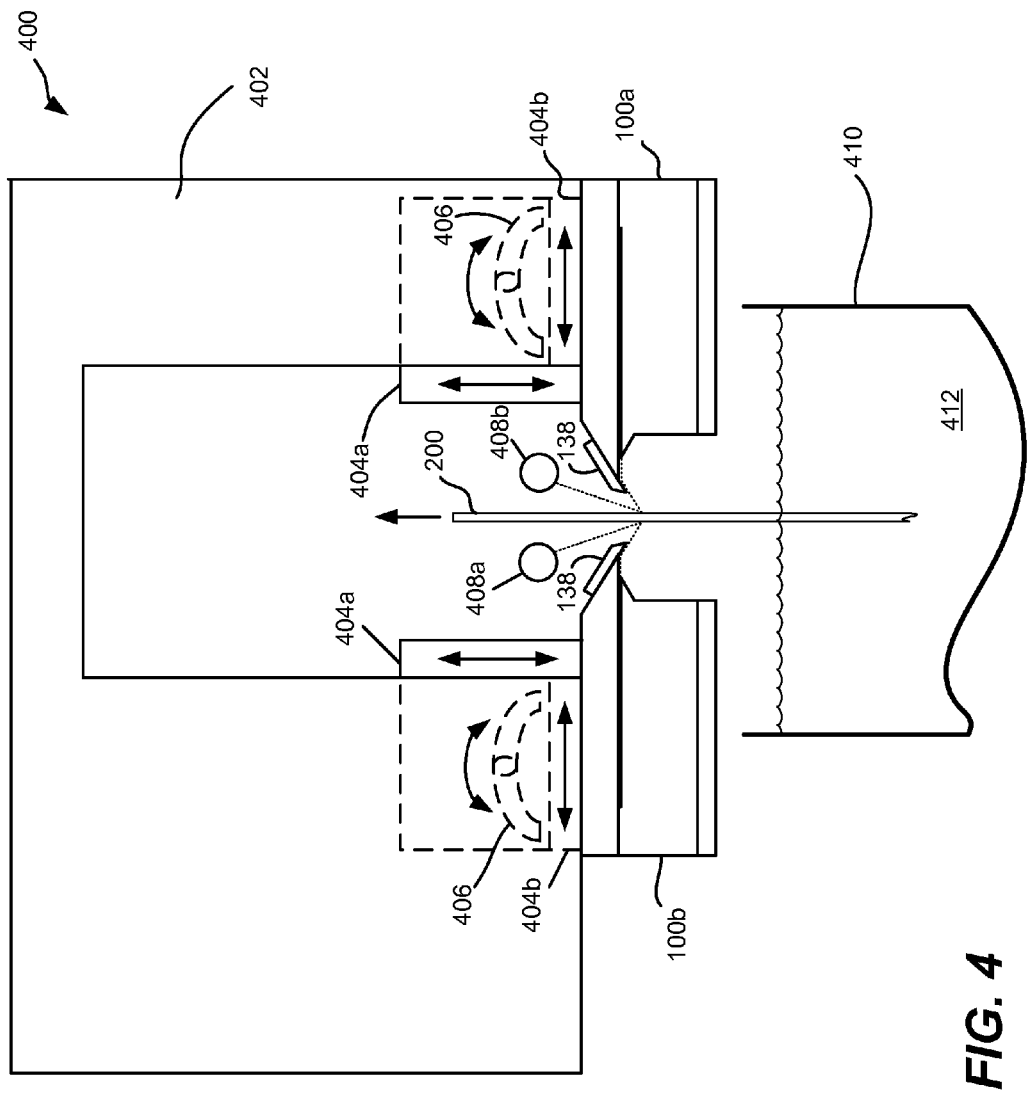
FIG. 4 is a side schematic illustration of an example system for rinsing and/or drying a substrate in accordance with embodiments of the invention provided herein.

FIG. 4 is a side schematic illustration of an example system 400 for rinsing and/or drying a substrate in accordance with embodiments of the invention. With reference to FIG. 4, waterfall apparatus 100a and 100b are shown coupled to a mounting frame 402. The mounting frame 402 allows adjustment of height, distance between and/or rotation of the waterfall apparatus 100a and 100b. For example, first slide mechanisms 404a and 404b such as adjustable clamps, slide bearings, adjustment screws or bolts or the like may be employed to adjust the height of and/or spacing between the waterfall apparatus 100a and 100b. Similarly, a pivot mechanism 406, such as a slotted guide, may be employed to adjust rotation of each waterfall apparatus 100a and 100b. The mounting frame 402 may be formed from any suitable material such as aluminum, stainless steel, PEEK, a combination of the same, or the like.

Figure 5:
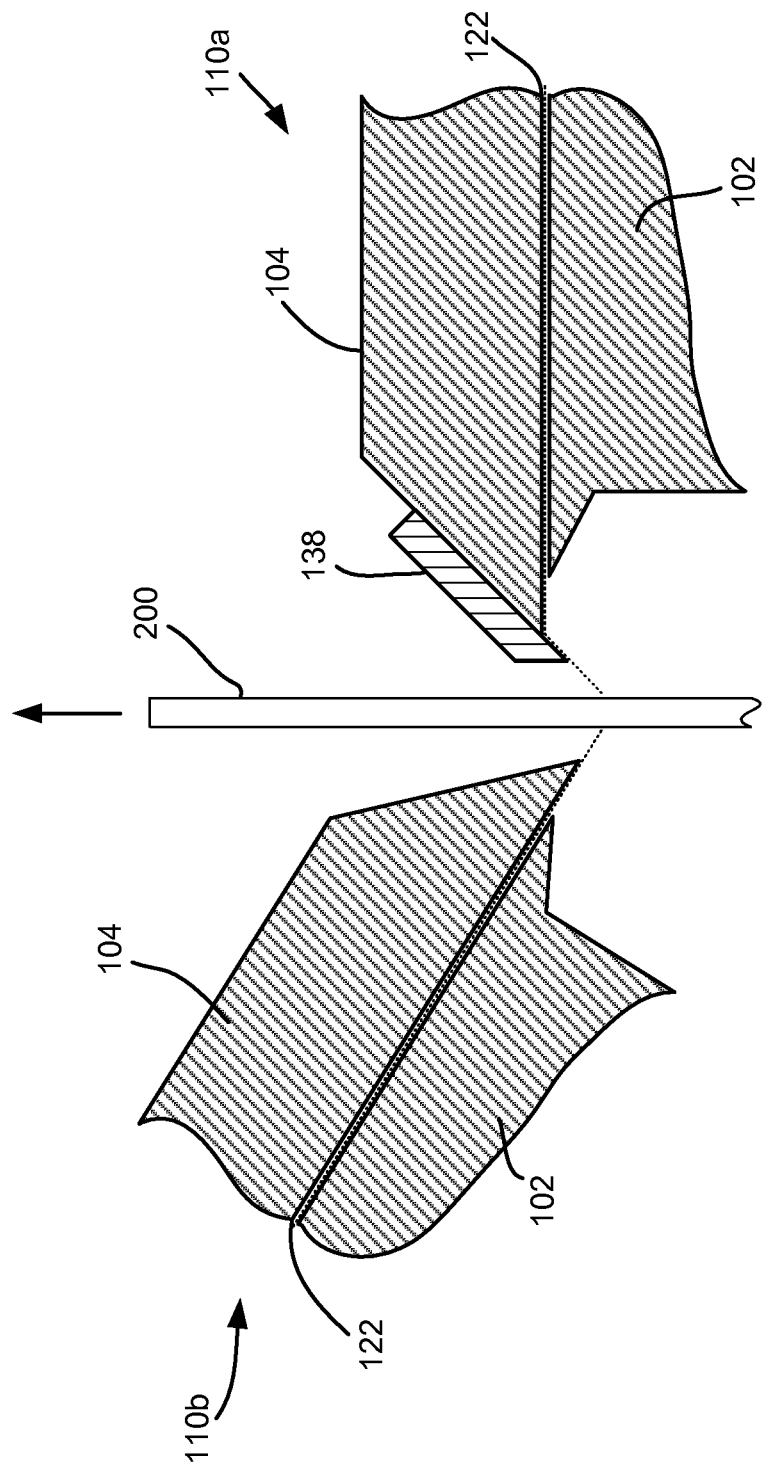
FIG. 5 illustrates an example embodiment in which the waterfall apparatus of FIG. 1B does not employ a flow deflector and is rotated so that rinsing fluid exiting the waterfall apparatus strikes a substrate at a predetermined angle in accordance with one or more embodiments of the invention provided herein.

In the embodiment of FIG. 4, each waterfall apparatus 100a and 100b employs a flow deflector 138 to direct rinsing fluid supplied by the waterfall apparatus 100a and 100b toward the substrate 200 at a desired angle. In some embodiments, the rinsing fluid may strike the substrate 200 an angle between about 40 and 60 degrees, and in some embodiments about 45-50 degrees, (relative to the major surface of the substrate 200 or from vertical in FIG. 4) during substrate rinsing. When flow deflectors 138 are employed, each waterfall apparatus 100a and 100b may be oriented approximately horizontally as shown in FIG. 4 (e.g., approximately perpendicular to the substrate 200). FIG. 5 illustrates an example embodiment in which waterfall apparatus 100b does not employ a flow deflector 138 and is rotated so that rinsing fluid exiting the slot 122 strikes the substrate 200 at a predetermined angle.

With reference to FIG. 4, in some embodiments, the system 400 may include solvent vapor delivery mechanisms 408a and 408b for delivering a solvent vapor to the rinsing fluid/substrate interface to affect Marangoni drying of the substrate 200. During Marangoni drying with the system 400, a solvent vapor (such as IPA) miscible with the rinsing fluid is introduced to each fluid meniscus which forms as the substrate 200 is lifted through the waterfalls provided by waterfall apparatus 100a and 100b. The solvent vapor is absorbed along the surface of the rinsing fluid, with the concentration of the absorbed vapor being higher at the tip of each meniscus. The higher concentration of absorbed vapor causes surface tension to be lower at the tip of each meniscus than in the bulk of the rinsing fluid, causing rinsing fluid to flow from each drying meniscus toward the rinsing fluid. Such a flow is known as a "Marangoni" flow, and can be employed to achieve substrate drying without leaving streaks, spotting or rinsing fluid residue on the substrate. It will be understood that the waterfall apparatus 100a and/or 100b may be employed to rinse substrates whether or not substrate drying is performed.

In some embodiments, the system 400 may be employed to Marangoni dry a substrate removed from a tank or bath 410 containing a rinsing fluid 412. In one or more embodiments, particle re-attachment during substrate rinse may be avoided by submersion of the substrate 200 into rinsing fluid 412 in the tank 410 and by adding a chemistry such as an acid or base, an organic alkaline, TMAH, ammonium hydroxide, another pH adjuster, or the like to the rinsing fluid 412 within the tank 410. The substrate 200 then may be lifted out of the tank 410 through the waterfalls from waterfall apparatus 100a and 100b for rinsing and/or Marangoni drying as described above. The resultant rinsing fluid curtain from each waterfall 100a, 100b effectively rinses chemistry from the substrate 200, and the $N_2$/IPA gas over each waterfall may provide Marangoni drying with reduced and/or minimized particle re-attachment.

Figure 6:
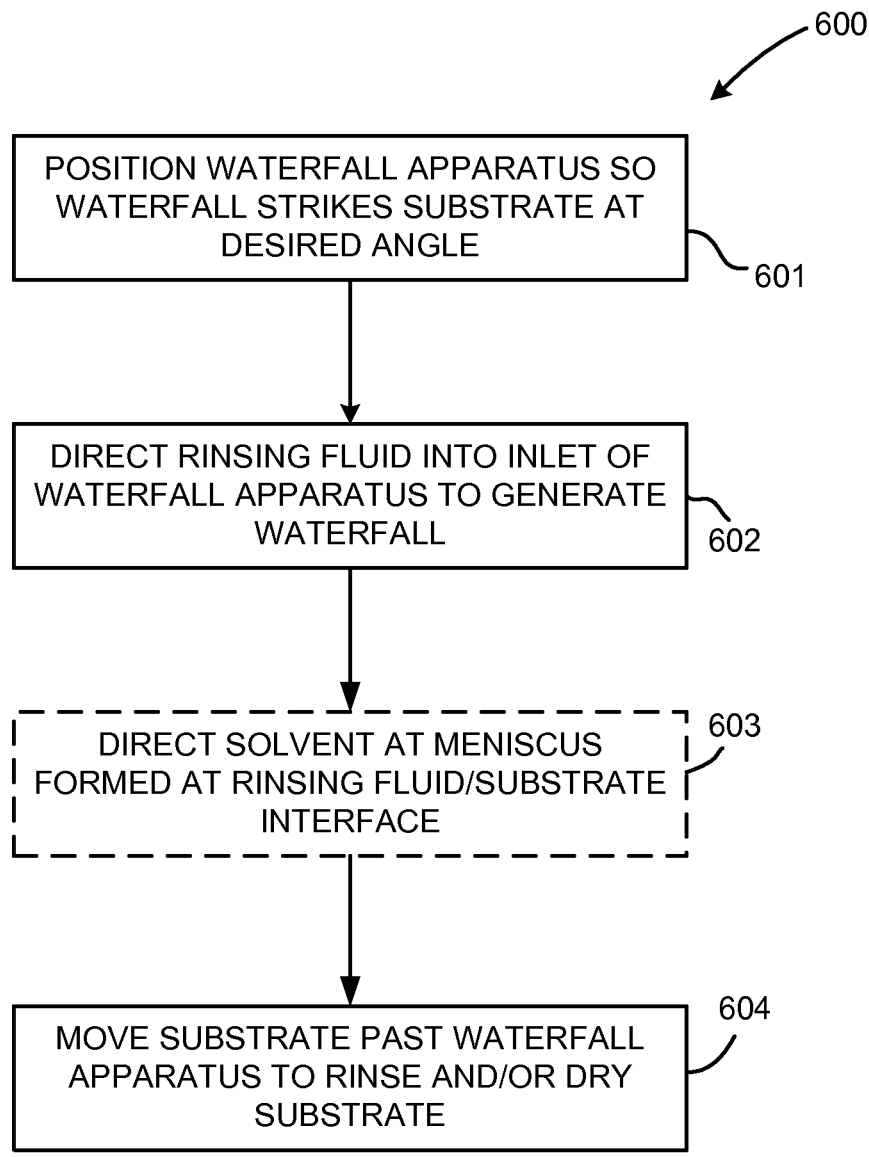
FIG. 6 is a flowchart of an example method of rinsing and/or drying a substrate provided in accordance with embodiments of the invention.

FIG. 6 is a flowchart of an example method 600 of rinsing and/or drying a substrate provided in accordance with embodiments of the invention. With reference to FIG. 6, in Block 601 the waterfall apparatus 100a and/or 100b is positioned so that rinsing fluid produced by the waterfall apparatus 100a and/or 100b strikes a substrate at a desired angle. For example, each waterfall apparatus 100a and 100b may be angled and/or flow deflectors 138 may be employed to direct rinsing fluid output by slot 122 at the substrate 200 at a desired angle (e.g., 40-60 degrees relative to the surface being rinsed in some embodiments).

In Block 602 rinsing fluid is provided to the inlet 110 of each waterfall apparatus 100a and 100b. Rinsing fluid travels through the inlet 110 to first plenum 112, through restricted fluid path 116 to second plenum 114 and from second plenum 114 through slot 122 to form a rinsing fluid waterfall that strikes the substrate 200. Example flow rates provided to the inlet 110 of each waterfall apparatus 100a and 100b range from about 4 to about 8 liters/minute, and in some embodiments about 5 to about 6 liters/minute. Other flow rates may be employed. Flow rate may depend on such factors as slot height, slot width, surface tension of the rinsing fluid, distance between the waterfall apparatus and the substrate, the angle at which the rinsing fluid strikes the substrate, etc.

In some embodiments, in Block 603, a solvent vapor such as IPA may be directed at each waterfall/substrate interface to affect Marangoni drying of the substrate.

In Block 604 the substrate 200 is moved past (e.g., between) the waterfall apparatus 100a and/or 100b to rinse and/or dry the substrate 200.

Each waterfall apparatus 100a and 100b may provide a highly uniform-flow rinsing fluid curtain that can span a full substrate diameter. Each waterfall apparatus 100a and 100b may provide a uniform slot exit velocity over a wide window of flow rates while reducing and/or minimizing cost, space, and pressure drop. In addition, through use of flow deflectors and/or angling the waterfall apparatus, adjustments may be made to the angle at which a flow stream strikes a substrate. Adjustments to the horizontal gap between the flow exit of the waterfall apparatus and the substrate surface may be made using the mounting frame 402, for example.

The system 400 and/or waterfall apparatus 100a and/or 100b may create a uniform rinsing fluid curtain (waterfall) through which a substrate may be moved, effectively rinsing both sides of the substrate. The addition of a solvent gas flow, such as nitrogen/IPA, above the rinsing fluid curtain enables effective drying of the substrate through the Marangoni process. Robust rinsing and drying of the substrate may be provided through uniform rinsing fluid flow across the length of the waterfall apparatus 100a and/or 100b (e.g., via slot 122).

The angle that rinsing fluid exits the waterfall apparatus 100a or 100b may affect meniscus shape of the rinsing fluid curtain when it contacts the substrate 200. In some embodiments, a pure horizontal flow exiting the waterfall apparatus 100a or 100b that strikes the substrate 200 approximately perpendicularly may produce a large and unstable meniscus. Angles between about 40 and 60 degrees relative to the surface of the substrate may create a more stable meniscus on the substrate and/or may be more conducive to Marangoni drying applications.

The angle at which rinsing fluid exits the waterfall apparatus 100a or 100b may be controlled several ways. For example, flow deflector 138 may be attached to the waterfall apparatus 100a or 100b. Various angles may be machined into the flow deflector 138. In some embodiments, the flow deflector 138 may be machined directly into the outlet 124 of the waterfall apparatus 100a or 100b.

As illustrated in FIG. 4, the waterfall apparatus 100a and 100b may be attached to a mounting frame 402 that allows adjustment of the distance between the waterfall apparatus 100a/100b and the substrate 200. In some embodiments, a (horizontal) gap between the waterfall apparatus 100a and the waterfall apparatus 100b may be about 10 to 30 mm. Other gaps may be employed.

In some embodiments, the mounting frame 402 may allow adjustment of the position of the solvent vapor (e.g., $N_2$/IPA) delivery mechanisms 408a-b relative to the waterfall apparatus 100a or 100b to improve and/or optimize position and/or angle of impingement of solvent onto any meniscus formed by waterfall(s) rinsing the substrate. Example solvent vapor impingement angles and/or rates range from about 40 to about 80 degrees, and in some embodiments about 55 to 65 degrees (from horizontal for a vertically oriented substrate), and about 3 to 12 liters/minute, and in some embodiments from about 4.5 to 6 liters/minute. Other solvent vapor impingement angles and/or rates may be employed.

As stated, the waterfall apparatus 100a and 100b may provide a highly uniform rinsing fluid flow across an entire surface of a substrate (e.g., flow rate variation of less than about 1% in some embodiments). A more uniform rinsing fluid flow may yield a more robust rinsing and drying process across the substrate. Additionally, air/bubble formation may be reduced within the waterfall apparatus 100a and/or 100b.

In general, the first and second plenums 112, 114 may be triangular, circular or any other suitable shape. In some embodiments, the restricted fluid path 116 may include a series of openings rather than a single opening that extends the length of the slot 122. In some embodiments, the slot 122 may be formed by using a saw-tooth or similarly shaped spacer that provides a series of openings across the length of the waterfall apparatus rather than a continuous opening. For example, in some embodiments, a saw-tooth-shaped spacer may be employed between the first and second coupling surfaces 118 and 120 to create a series of openings across the slot 122 (rather than a single opening).

While the waterfall apparatus 100a and/or 100b has been described as using two plenums, it will be understood that additional plenums may be employed (e.g., 3, 4 or more plenums coupled by restricted fluid paths).

In some embodiments, the inlet to the waterfall apparatus 100a and/or 100b may be positioned in other locations of the second portion 104 or on the first portion 102 (e.g., directly feeding the first plenum 112, for example). In some embodiments, a waterfall apparatus configured to provide rinsing fluid to a substrate may include (1) a first portion having (a) a first plenum, a second plenum separated from the first plenum, and a restricted fluid path between the first and second plenums; (b) a first coupling surface; and (c) an inlet opening that creates a fluid path to the first plenum; and (2) a second portion having a second coupling surface. The first coupling surface of the first portion and the second coupling surface of the second portion form a slot that extends along at least a portion of a length of the waterfall apparatus and that connects to the second plenum. Fluid introduced into the inlet opening of the first portion fills the first plenum of the first portion, travels through the restricted fluid path to the second plenum, and exits the slot between the first and second portions to form a rinsing fluid waterfall. In some embodiments, a substrate may be positioned in front of the slot of the waterfall apparatus and rinsing fluid may be directed into the inlet opening of the first portion to fill the first plenum of the first portion so that the rinsing fluid travels through the restricted fluid path to the second plenum, and exits the slot between the first and second portions to form a rinsing fluid waterfall. The rinsing fluid waterfall may be directed at the substrate to rinse the substrate.

Accordingly, while the present invention has been disclosed in connection with example embodiments thereof, it should be understood that other embodiments may fall within the scope of the invention, as defined by the following claims.

What is claimed is:

1. A waterfall apparatus configured to provide rinsing fluid to a substrate comprising:

a lower portion having:
  a first width;
  a first plenum, a second plenum separated from the first plenum and located above the first plenum, and a restricted fluid path extending between the first and second plenums; and
  a first surface located on an upper side of the lower portion; and
  an inlet opening that creates a fluid path between the first surface and the first plenum; and
an upper portion at least partially coupled to the lower portion having:
  a second width that is larger than the first width; and
  a second surface located on a lower side of the upper portion; and
  an inlet that aligns with the inlet opening of the lower portion to create a fluid path to the first plenum through the upper portion;
wherein the first surface of the lower portion and the second surface of the upper portion form a slot that extends along at least a portion of a length of the waterfall apparatus and that connects to the second plenum; and
wherein fluid introduced into the inlet of the upper portion fills the first plenum of the lower portion, travels through the restricted fluid path to the second plenum, and exits the slot between the upper and lower portions to form a rinsing fluid waterfall.

2. The waterfall apparatus of claim 1 wherein the slot formed between the upper and lower portions has a length that is longer than a diameter of a substrate rinsed with the waterfall apparatus.

3. The waterfall apparatus of claim 2 wherein the slot has a length that is approximately 10 to 100 mm longer than a diameter of a substrate rinsed with the waterfall apparatus.

4. The waterfall apparatus of claim 3 wherein the slot has a length that is approximately 30 to 70 mm longer than a diameter of a substrate rinsed with the waterfall apparatus.

5. The waterfall apparatus of claim 2 wherein the slot is approximately 310 to 400 mm in length.

6. The waterfall apparatus of claim 5 wherein the slot is approximately 330 to 370 mm in length.

7. The waterfall apparatus of claim 1 wherein the slot has a height of approximately less than 0.5 mm.

8. The waterfall apparatus of claim 7 wherein the slot has a height of less than approximately 0.2 mm.

9. The waterfall apparatus of claim 1 wherein the first plenum includes a first side, a second side opposite the first side and a third side extending between the first side and the second side, wherein the first side is shorter than the second side and the third side extends between the first and second sides at an angle relative to the first surface of the lower portion.

10. The waterfall apparatus of claim 9 wherein the angle of the third side is between about 1 and 10 degrees relative to the first surface.

11. The waterfall apparatus of claim 10 wherein the angle of the third side is between about 3 and 6 degrees relative to the first surface.

12. The waterfall apparatus of claim 1 wherein at least one of the restricted flow path has a length equal to a length of the slot and the first and second plenums have a length equal to a length of the slot.

13. The waterfall apparatus of claim 1 wherein the second surface of the upper portion has a width that is larger than a width of the first surface of the lower portion so that fluid travelling through the slot formed between the first and second surfaces breaks contact with the first surface prior to the second surface.

14. The waterfall apparatus of claim 1 wherein the upper portion includes a flow deflector positioned at an end of the slot that redirects rinsing fluid flowing through the slot at an angle relative to the second surface of the upper portion.

15. The waterfall apparatus of claim 14 wherein the angle is approximately 40 to 60 degrees relative to the second surface.

* * * * *